US011924984B2

(12) United States Patent
Chen et al.

(10) Patent No.: US 11,924,984 B2
(45) Date of Patent: Mar. 5, 2024

(54) DISPLAY DEVICE

(71) Applicant: Qisda Corporation, Taoyuan (TW)

(72) Inventors: Jen-Feng Chen, Taichung (TW);
Yien-Bo Chen, Taoyuan (TW);
Kuan-Hsu Lin, New Taipei (TW);
Hsin-Hung Lin, Taoyuan (TW);
Nien-Tsung Hsu, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 17/668,450

(22) Filed: Feb. 10, 2022

(65) Prior Publication Data
US 2022/0346245 A1    Oct. 27, 2022

(30) Foreign Application Priority Data

Apr. 21, 2021   (TW) ................................. 110114404

(51) Int. Cl.
*G06F 1/16* (2006.01)
*H05K 5/02* (2006.01)
(52) U.S. Cl.
CPC ......... *H05K 5/0204* (2013.01); *G06F 1/1601* (2013.01)
(58) Field of Classification Search
CPC ..... H05K 5/0204; F16M 11/04; G06F 1/1601
See application file for complete search history.

(56) References Cited

U.S. PATENT DOCUMENTS

| 6,418,010 | B1 * | 7/2002 | Sawyer | F16M 11/14 |
| | | | | 361/801 |
| 7,121,516 | B1 * | 10/2006 | Koh | F16M 13/022 |
| | | | | 248/227.2 |
| 8,235,341 | B2 * | 8/2012 | Taylor | F16M 13/02 |
| | | | | 248/274.1 |
| 9,027,893 | B2 * | 5/2015 | Cheng | F16M 13/02 |
| | | | | 248/231.9 |
| 9,408,465 | B2 * | 8/2016 | Dowling | H05K 5/0217 |
| 9,615,664 | B2 * | 4/2017 | Sun | F16M 11/048 |
| 9,829,151 | B1 * | 11/2017 | Stenhouse | F16M 11/16 |
| 11,480,288 | B2 * | 10/2022 | Huang | F16M 11/10 |
| 2019/0003631 | A1 * | 1/2019 | Hung | F16M 11/041 |

FOREIGN PATENT DOCUMENTS

| CN | 205298973 U | * | 6/2016 | |
| CN | 105937688 B | * | 5/2018 | ........... F16M 11/041 |
| CN | 105937688 B | | 5/2018 | |
| CN | 209245661 U | * | 8/2019 | |
| CN | 209245661 U | | 8/2019 | |

OTHER PUBLICATIONS

Translation of CN-105937688-B (Year: 2018).*
Translation of CN-205298973-U (Year: 2016).*
Translation of CN-209245661-U (Year: 2019).*
ZeosPantera, "Z How—Magnetic Monitor Mount", Aug. 3, 2015, YouTube, times 0:17-0:42 and 1:01-1:20, Retrieved from https://www.youtube.com/watch?v=lwt7qX_7elA (Year: 2015).*
Office action of counterpart application by Taiwan IP Office dated Oct. 8, 2021.

* cited by examiner

*Primary Examiner* — Adrian S Wilson

(57) ABSTRACT

A display including a screen, a bracket, a hanging element and a fixing element is provided. The support is connected to the screen and has a top end and a bottom end. The hanging element is disposed on the top end. The fixing element is disposed at the bottom end. When the hanging element is hung on an upper edge of a plate, the fixing element is fixed on a surface of the plate.

16 Claims, 10 Drawing Sheets

DISPLAY DEVICE

This application claims the benefit of Taiwan application Serial No. 110114404, filed Apr. 21, 2021, the subject matter of which is incorporated herein by reference.

BACKGROUND OF THE INVENTION

Field of the Invention

The invention relates in general to a display.

Description of the Related Art

Conventional display includes a screen, a support and a base. The support connects the screen and the base. In order to adjust the angle of the screen, the screen and the support normally are pivotally connected by rotating with respect to each other. The base could only be horizontally placed on a plane (such as a desktop). However, such structure confines the placement of the display to a plane, hence limiting the configuration and application of the display. Therefore, it has become a prominent task for the industries to provide a new display capable of resolving the above problems encountered in the prior art.

SUMMARY OF THE INVENTION

The invention is directed to a display of resolving the above problems encountered in the prior art.

According to one embodiment of the present invention, a display including a screen, a bracket, a hanging element and a fixing element is provided. The support is connected to the screen and has a top end and a bottom end. The hanging element is disposed on the top end. The fixing element is disposed at the bottom end. When the hanging element is hung on an edge of a plate (e.g., an upper edge of the plate), the fixing element is fixed on a surface of the plate.

According to another embodiment of the present invention, a display including a screen, a bracket, a hanging element and a base is provided. The support is connected to the screen and has a top end and a bottom end. The hanging element is disposed on the top end. The base is detachably connected to the bottom end. When the base connects the bottom end, the display supports the screen through the base. When the base is detached, the screen is hung on an edge of a plate through the hanging element.

The above and other aspects of the invention will become better understood with regard to the following detailed description of the preferred but non-limiting embodiment (s). The following description is made with reference to the accompanying drawings.

DETAILED DESCRIPTION OF THE INVENTION

Figure 1:
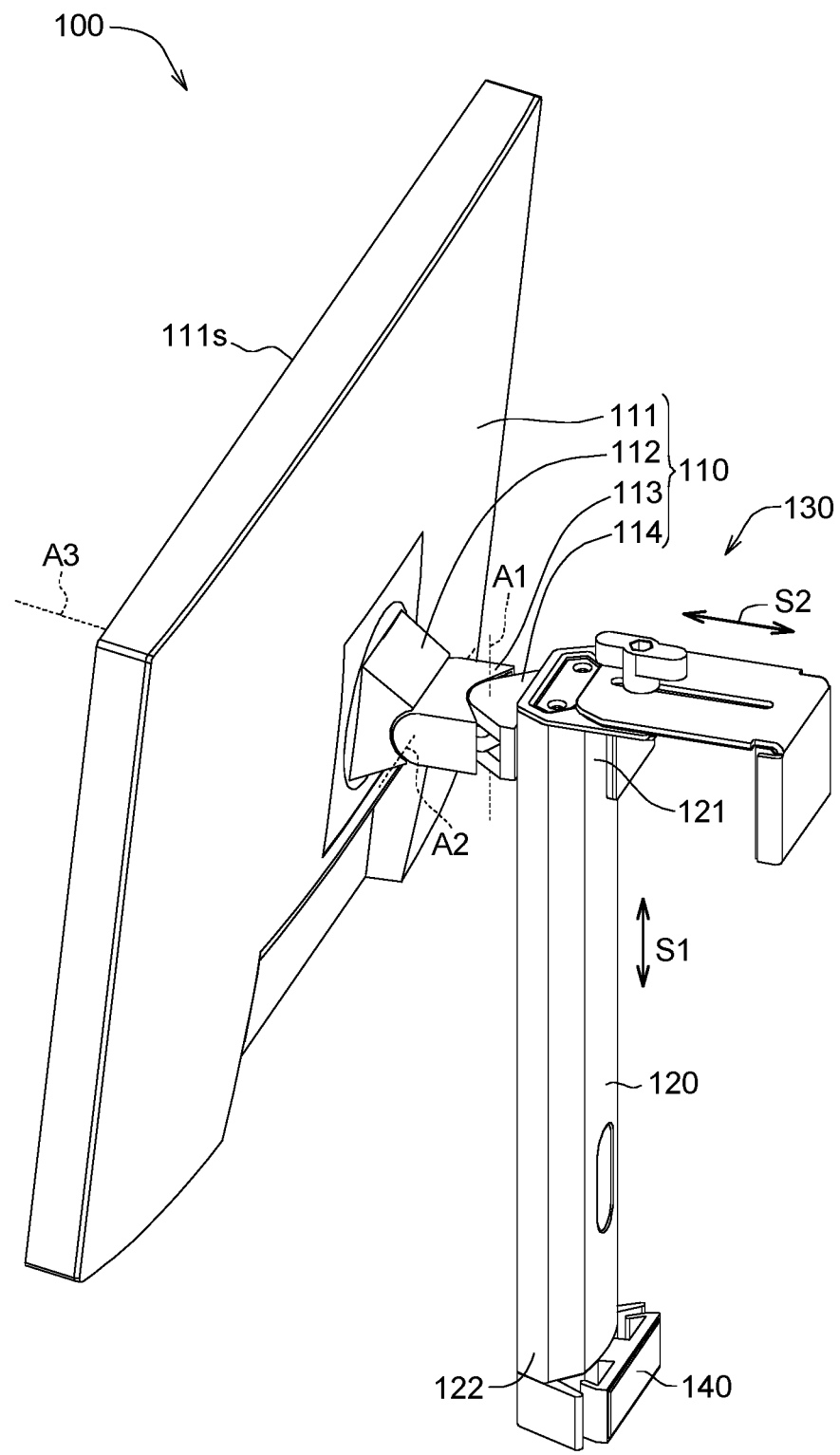
FIG. 1 is a schematic diagram of a display according to an embodiment of the present invention.
Figure 2:
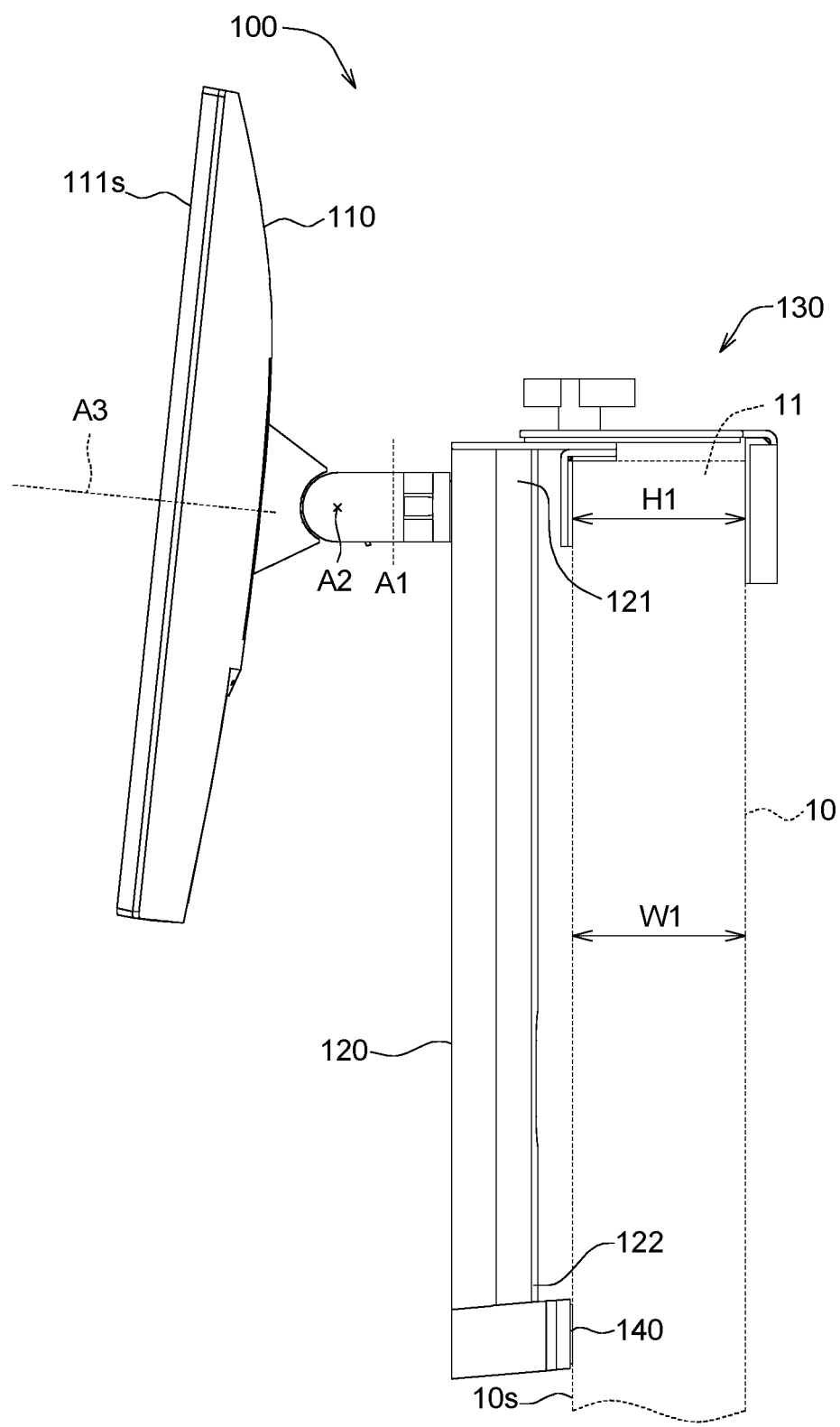
FIG. 2 is a side view of the display of FIG. 1.
Figure 3:
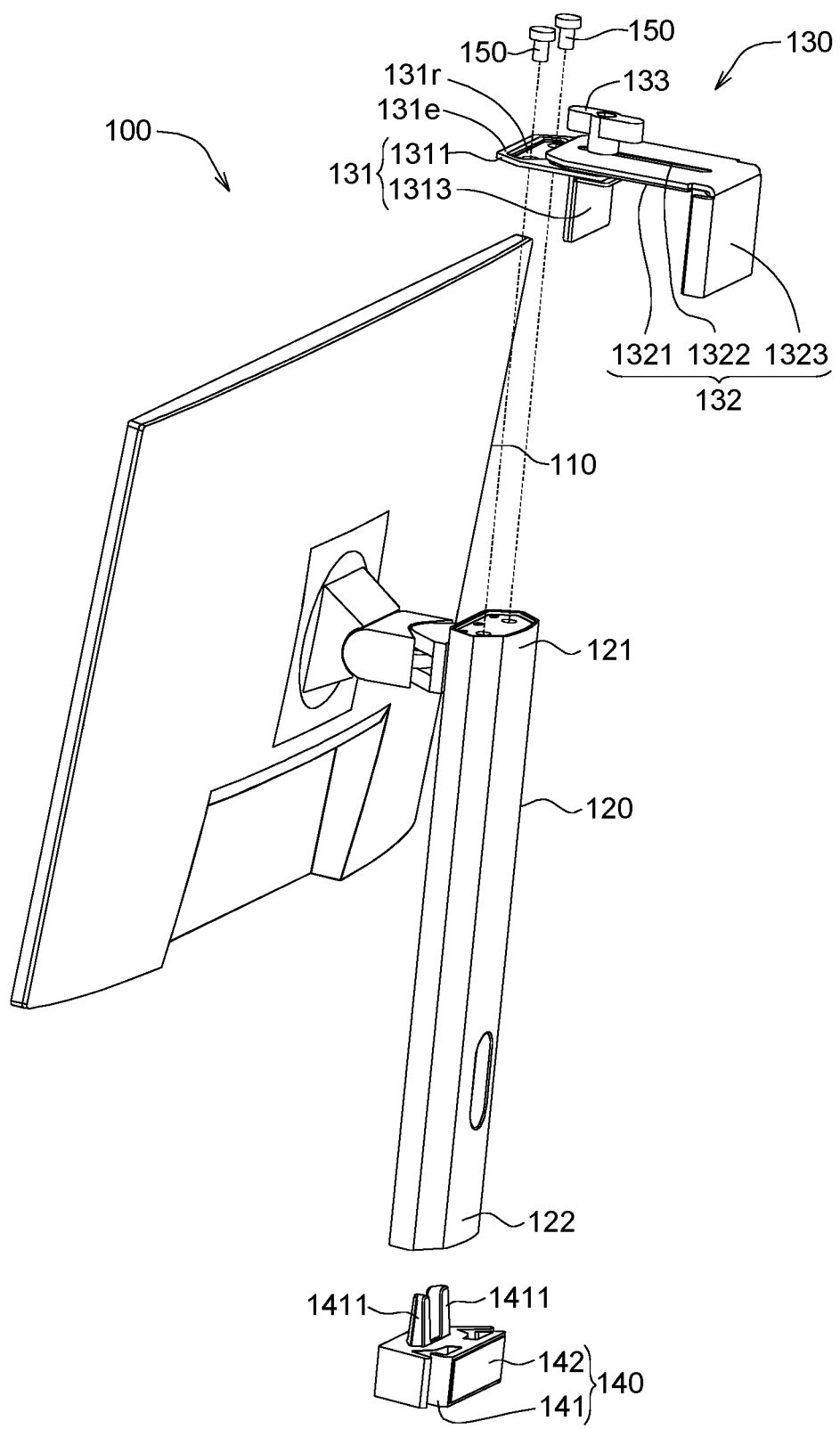
FIGS. 3 and 4 are explosion diagrams of the display of FIG. 1 viewed from different view angles.
Figure 4:
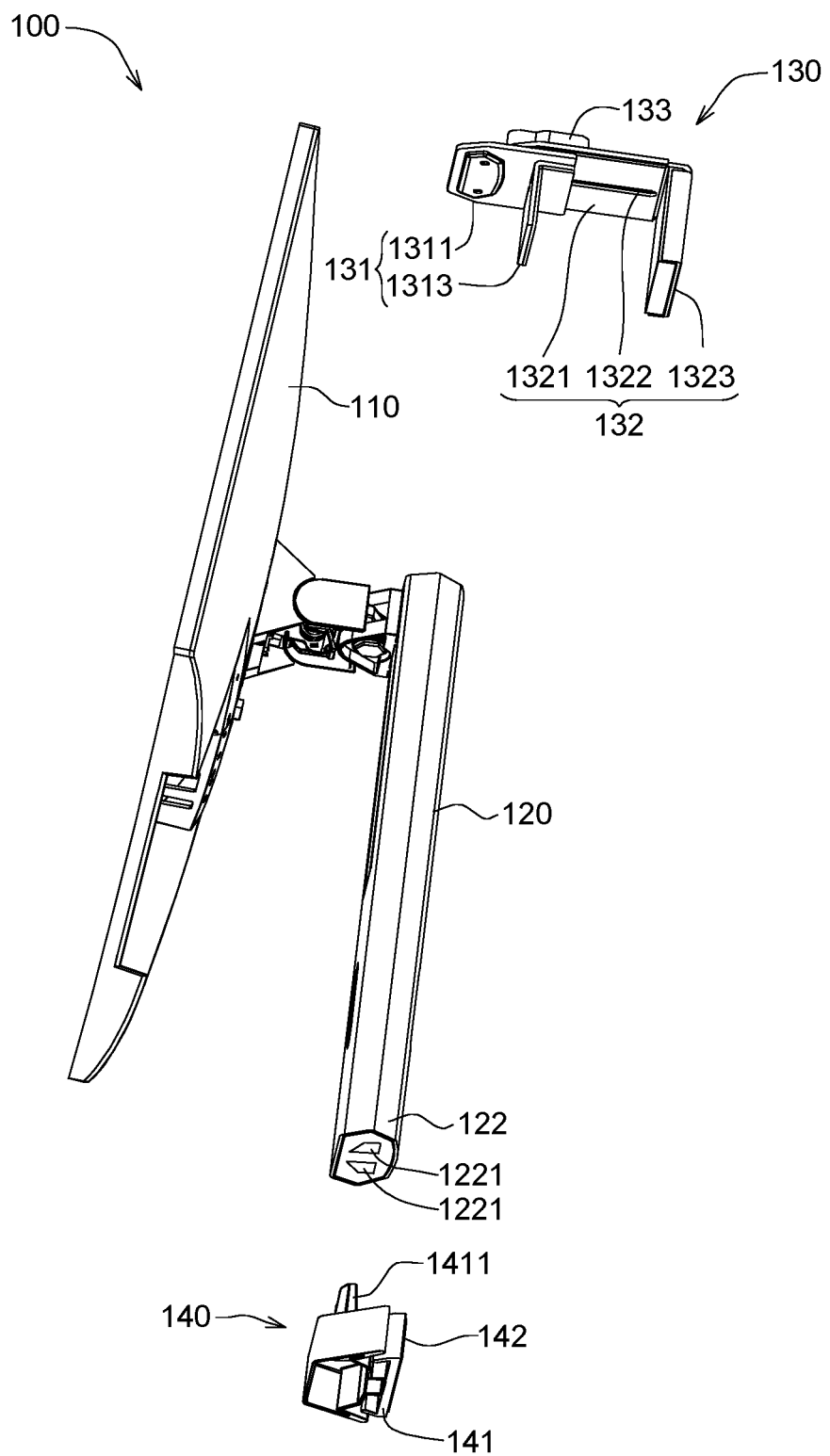
Figure 5:
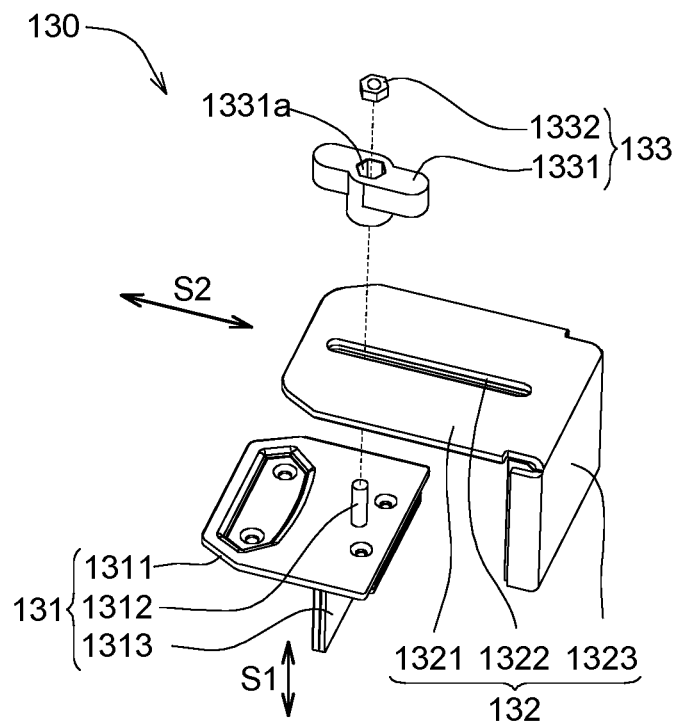
FIGS. 5 and 6 are explosion diagrams of the hanging element of FIG. 1 viewed from different view angles.
Figure 6:
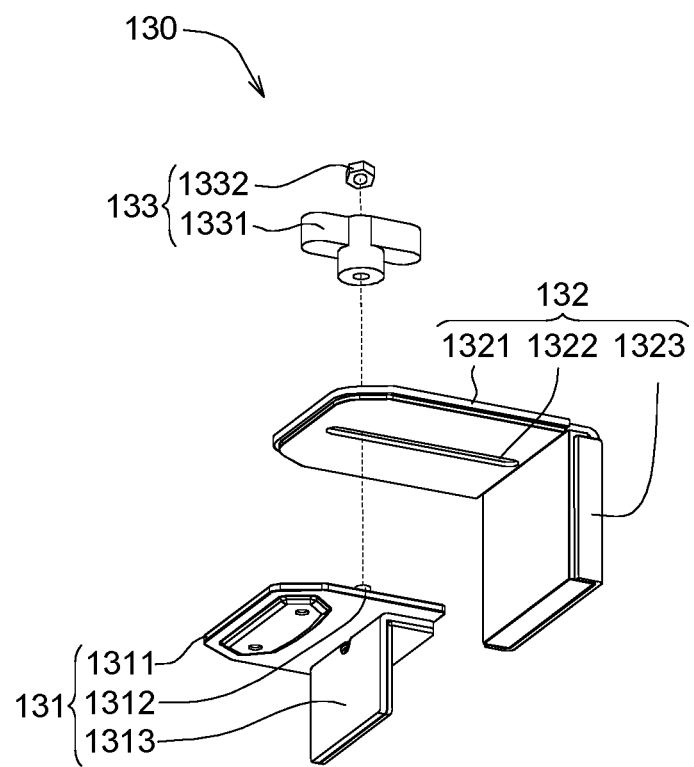

Refer to FIGS. 1 to 6, FIG. 1 is a schematic diagram of a display 100 according to an embodiment of the present invention. FIG. 2 is a side view of the display 100 of FIG. 1, FIGS. 3 and 4 are explosion diagrams of the display 100 of FIG. 1 viewed from different view angles, and FIGS. 5 and 6 are explosion diagrams of the hanging element 130 of FIG. 1 viewed from different view angles.

As indicated in FIGS. 1 and 2, the display 100 includes a screen 110, a support 120, a hanging element 130 and a fixing element 140. The support 120 is connected to the screen 110 and has a top end 121 and a bottom end 122. The hanging element 130 is disposed on the top end 121. The fixing element 140 is disposed at the bottom end 122. When the hanging element 130 is hung on an upper edge 11 of the plate 10, the fixing element 140 could be fixed on a surface 10s of the plate 10. Thus, the display 100 could be firmly hung on the plate 10.

To put it in greater details, when the display 100 is hung on the plate 10, the positions of the top end 121 and the bottom end 122 of the support 120 relative to the plate 10 are fixed (for example, the top end 121 and the bottom end 122 cannot be moved along direction S2, could hardly be rotated or cannot be rotated). Thus, the screen 110 could be rotated with respect to the support 120 (if the support 120 could be rotated, the screen 110 will synchronize with the support 120), the position/posture of the screen 110 relative to the support 120 could be adjusted through the structure connecting the screen 110 and the support 120.

The screen body 111 could rotate around at least one shaft (or axis direction) with respect to the support 120. As indicated in FIGS. 1 and 2, the screen 110 includes a screen body (for example, display panel) 111, a first pivoting piece 112, a second pivoting piece 113 and a third pivoting piece 114, wherein the third pivoting piece 114 and the second pivoting piece 113 could be rotatably swiveled with respect to the first shaft A1 (or axis direction); the first pivoting piece 112 and the second pivoting piece 113 could be rotatably tilted with respect to the second shaft A2; the screen body 111 and the first pivoting piece 112 could be rotatably pivoted with respect to the third shaft A3, wherein two of the first shaft A1, the second shaft A2 and the third shaft A are perpendicular to each other; the third shaft A3 is parallel to the normal direction of the display surface 111s of the screen body 111. Besides, the third pivoting piece 114 and the support 120 could slide with respect to each other along the extension direction S1 of the support 120. For example, the support 120 has at least one chute (not illustrated), and the third pivoting piece 114 has at least one slider (not illustrated) pivotally connected to the chute, so that the third pivoting piece 114 and the support 120 could slide with respect to each other.

As disclosed above, the screen body 111 could rotate around the first shaft A1, the second shaft A2 and/or the third shaft A3 and/or slide along the extension direction S1 of the support 120. The present invention does not limit the pivoting mechanism/structure between the support 120 and the screen 110, and any mechanism/structure would do as long as the screen body 111 could rotate around the first shaft A1, the second shaft A2 and/or the third shaft A3, and/or could slide along the extension direction S1 of the support 120.

As indicated in FIGS. 3 and 4, the hanging element 130 could be detached from the top end 121 of the support 120, and the fixing element 140 also could be detached from the bottom end 122. However, the said arrangement is not for limiting the embodiment of the present invention.

As indicated in FIG. 3, the hanging element 130 includes a first position-limiting portion 131, a second position-limiting portion 132 and a fixing element 133. The first position-limiting portion 131 is fixed to the top end 121 of the support 120. For example, the first position-limiting portion 131 could be screwed on the terminal surface of the top end 121 of the support 120 through at least one screw element 150. The first position-limiting portion 131 has a terminal surface 131e and a recess 131r. The recess 131r is extended towards the bottom end 122 from the terminal surface 131e. The recess 131r could receive the screw element 150 to avoid the screw element 150 being protruded from the terminal surface 131e so that the screw element 150 will not obstruct the activities of the second position-limiting portion 132.

As indicated in FIGS. 2 and 3, the second position-limiting portion 132 and the first position-limiting portion 131 could move with respect to each other, so that the interval H1 between the second position-limiting portion 132 and the first position-limiting portion 131 could be adjusted according to the width W1 of the plate 10.

As indicated in FIGS. 3 and 5, the first position-limiting portion 131 includes a fixing board 1311, a first sliding portion 1312 and a first baffle 1313, wherein the first sliding portion 1312 and the first baffle 1313 are disposed on the fixing board 1311. The second position-limiting portion 132 includes a sliding board 1321, a second sliding portion 1322 and a second baffle 1323, wherein the second sliding portion 1322 and the second baffle 1323 are disposed on the fixing board 1311 and the sliding board 1321. In an embodiment, the fixing board 1311, the first sliding portion 1312 and the first baffle 1313 are integrally formed in one piece; or, at least one of the fixing board 1311, the first sliding portion 1312 and the first baffle 1313 could be independently formed and then is bonded to other ones using a temporary or permanent technology. Similarly, the sliding board 1321, the second sliding portion 1322 and the second baffle 1323 are integrally formed in one piece; or, at least one of the sliding board 1321, the second sliding portion 1322 and the second baffle 1323 could be independently formed and then is bonded to the other ones using a temporary or permanent technology. In terms of materials, the first position-limiting portion 131 and/or the second position-limiting portion 132 could be formed of sheet metal or plastics, but the materials of the first position-limiting portion 131 and/or the second position-limiting portion 132 are not restricted in the embodiment of the present invention.

As indicated in FIGS. 3 and 5, the fixing board 1311 of the first position-limiting portion 131 could be fixed to the top end 121. The first sliding portion 1312 and the second sliding portion 1322 could slide with respect to each other and be connected together. In the present embodiment, the first sliding portion 1312 could be realized by a protruding column, the second sliding portion 1322 could be realized by a chute, and the first sliding portion 1312 passes through the second sliding portion 1322, so that the first sliding portion 1312 and the second sliding portion 1322 could slide with respect to each other. Besides, the first sliding portion 1312 and the support 120 both are extended along the extension direction S1 (the extension direction S1 is illustrated in FIG. 1), and the second sliding portion 1322 is extended along the adjustment direction S2 (the adjustment direction S2 is illustrated in FIG. 1), wherein the adjustment direction S and the extension direction S1 are substantially perpendicular to each other.

As indicated in FIGS. 3 and 5, the first baffle 1313, the second baffle 1323 and the support 120 are extended along the extension direction S1, and the first baffle 1313 and the second baffle 1322 are separated from each other along the adjustment direction S2. When the first sliding portion 1312 and the second sliding portion 1322 slide with respect to each other along the adjustment direction S2, the interval H1 (illustrated in FIG. 2) between the first baffle 1313 and the second baffle 1322 could be adjusted along the adjustment direction S2.

As indicated in FIGS. 5 and 6, the fixing portion 133 selectively fixes or releases the first position-limiting portion 131 and the second position-limiting portion 132. For example, the first sliding portion 1312 has a male screw, the fixing portion 133 has a female screw, the male screw of the first sliding portion 1312 and the female screw of the fixing portion 133 could be screwed together to fix the second position-limiting portion 132 on the first position-limiting portion 131. For example, when the fixing portion 133 is fastened, the fixing portion 133 presses the sliding board 1321 of the second position-limiting portion 132 on the fixing board 1311 of the first position-limiting portion 131 to fix relative positions between the first position-limiting portion 131 and the second position-limiting portion 132. When the fixing portion 133 is released, the fixed relationship between the first position-limiting portion 131 and the second position-limiting portion 132 could be released.

As indicated in FIGS. 5 and 6, the fixing portion 133 includes a fixing body 1331 and a nut 1332. The nut 1332 is fixed in the via hole 1331a of the fixing body 1331. The nut 1332 has the said female screw. In another embodiment, the fixing body 1331 and the nut 1332 could be integrally formed in one piece.

As indicated in FIGS. 2 and 3, the fixing element 140 includes a body 141 and a fixing portion 142, wherein the fixing portion 142 is detachably disposed at the bottom end 122 of the support 120; the fixing portion 142 is disposed on the body 141. In the present embodiment, the fixing portion 142 could be realized by a magnetic element; the fixing element 140 and the surface 10s of the plate 10 could be bonded by a magnetic attraction force. In the present embodiment, the surface 10s could have magnetism or could be formed of a material that could be magnetically attracted. In another embodiment, a magnetic element or a substance that could be magnetically attracted (not illustrated) could be disposed on the surface 10s, so that the fixing element 140 with magnetism and the magnetic element disposed on a surface 10s of the plate 10 or a substance that could be magnetically attracted (not illustrated) could be bonded by a magnetic attraction force. One of the fixing portion 142 and the magnetic element disposed on surface 10s could be realized by a magnet, and the other one could be realized by a magnet or a magnetic element that could generate an induced magnetic field with the magnet.

As indicated in FIGS. 3 and 4, the body 141 and the bottom end 122 of the support 120 could be bonded using an engaging technology. For example, the body 141 includes at least one first engaging portion 1411, and the bottom end 122 includes at least one second engaging portion 1221. As the first engaging portion 1411 and the second engaging portion 1221 are bonded together, the body 141 and the support 120 could be mutually fixed. In the present embodiment, the first engaging portion 1411 could be realized by a protruding column, and the second engaging portion 1221 could be realized by a concave hole. In another embodiment, the first engaging portion 1411 could be realized by a concave hole, and the second engaging portion 1221 could be realized by a protruding column.

Figure 7:
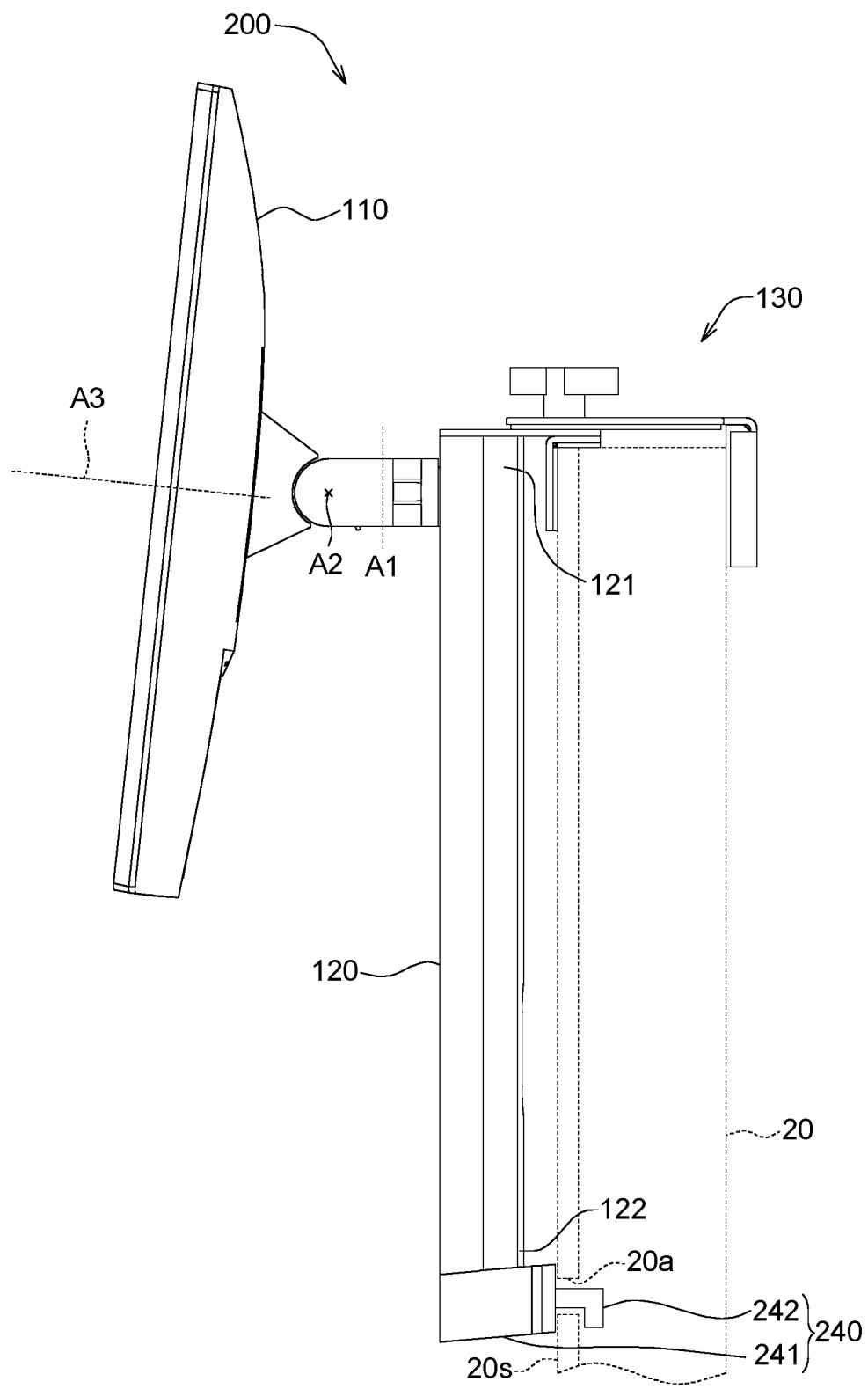
FIG. 7 is a schematic diagram of a display according to another embodiment of the present invention.

Referring to FIG. 7, a schematic diagram of a display 200 according to an embodiment of the present invention is shown. The display 200 includes a screen 110, a support 120, a hanging element 130 and a fixing element 240. Technical features of the display 200 of the present invention are similar or identical to that of the display 100 except that the fixing element 240 and the plate 20 are bonded using an engaging technology.

As indicated in FIG. 7, the fixing element 240 includes body 241 and a fixing portion 242, wherein the fixing portion 242 is detachably disposed at the bottom end 122 of the support 120, and the fixing portion 142 is disposed on the body 241. In the present embodiment, the fixing portion 242 could be realized by a hook. The plate 20 has a hole 20a which is extended from the surface 20s in a direction away from the display 200. The fixing portion 242 and the hole 20a are hooked to fix relative positions between the plate 20 and the fixing portion 242.

Figure 8:
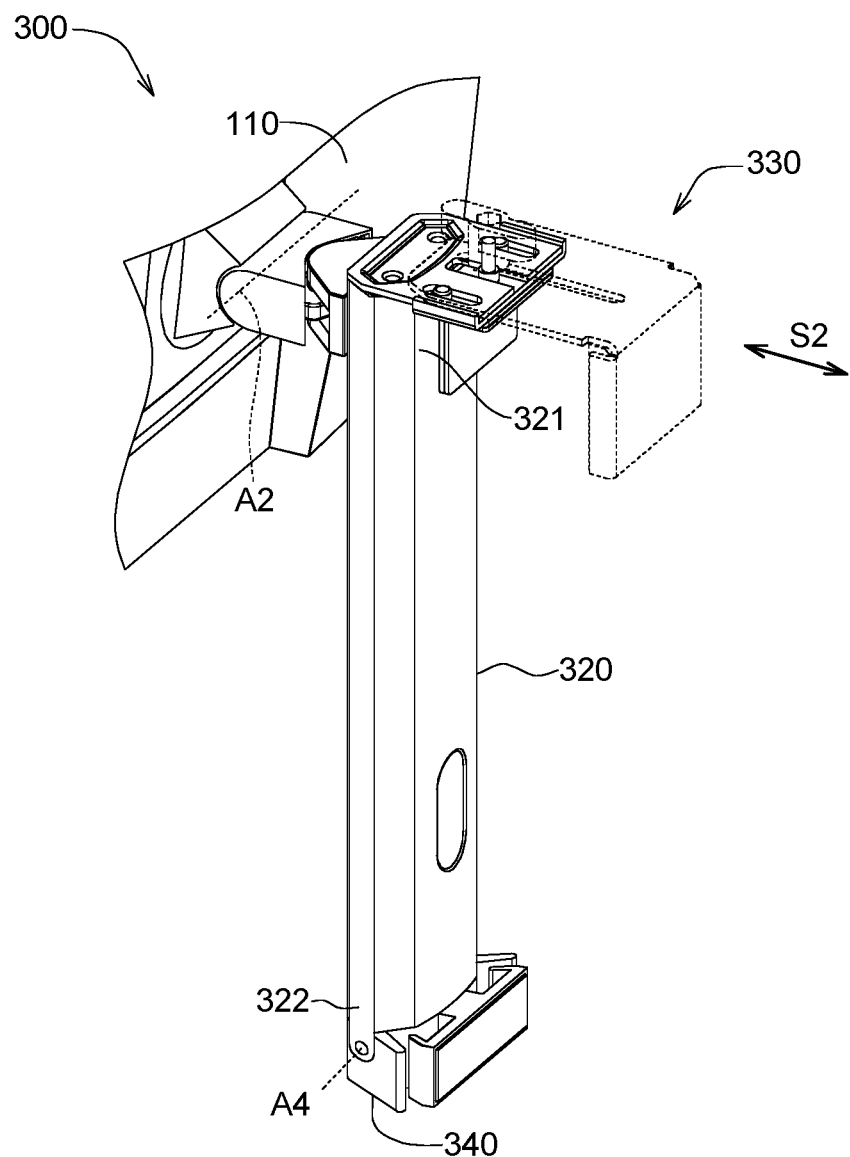
FIG. 8 is a schematic diagram of a display according to another embodiment of the present invention.
Figure 9:
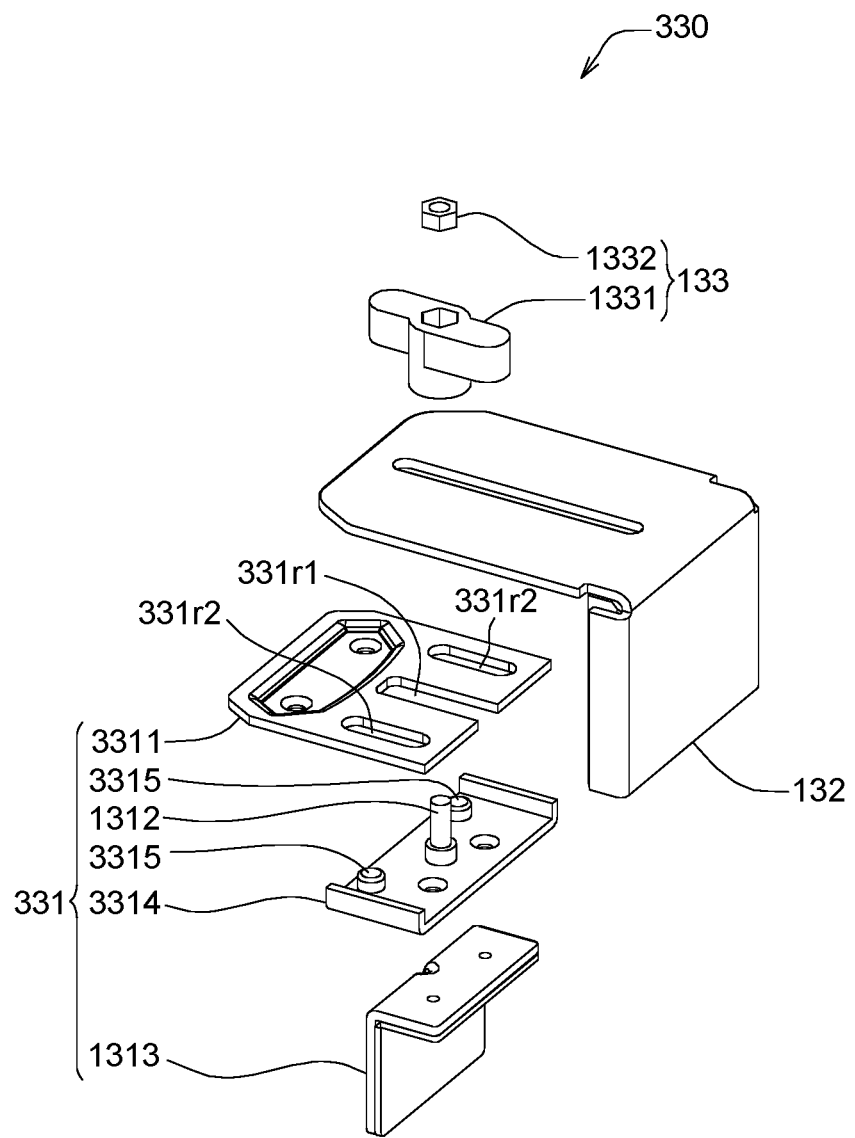
FIG. 9 is an explosion diagram of the hanging element of FIG. 8.
Figure 10:
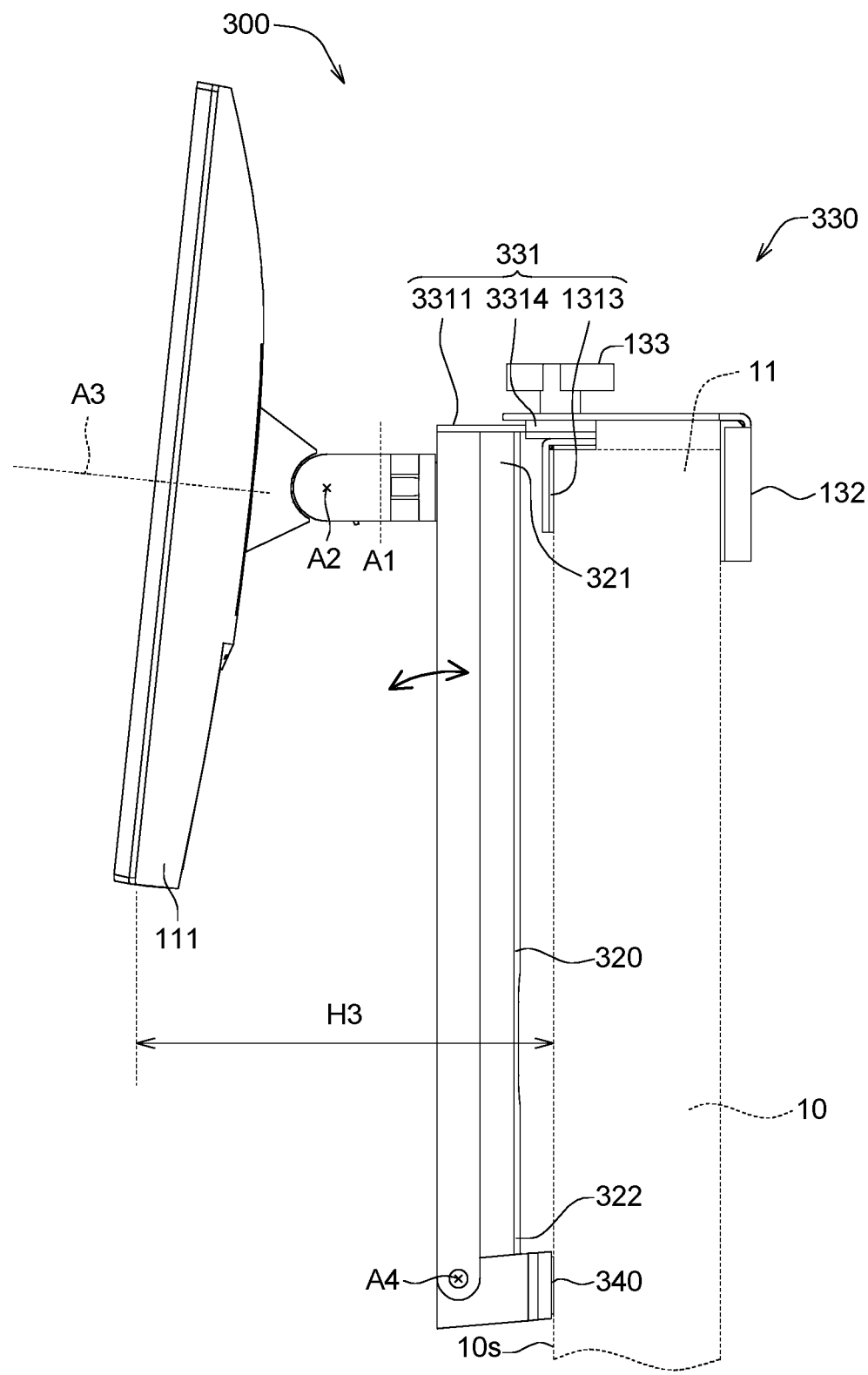
FIG. 10 is a side view of the display of FIG. 8.

Refer to FIGS. 8 to 10, FIG. 8 is a schematic diagram of a display 300 according to another embodiment of the present invention, FIG. 9 is an explosion diagram of the hanging element 330 of FIG. 8, and FIG. 10 is a side view of the display 300 of FIG. 8.

As indicated in FIGS. 8 and 9, the display 300 includes a screen 110, a support 320, a hanging element 330 and a fixing element 340. Technical features of the display 300 of the present invention are similar or identical to that of the display 100 except that the bottom end 322 of the support 320 and the fixing element 340 could be pivotally connected by rotating with respect to each other, and the top end 321 of the support 320 and the second position-limiting portion 132 of the hanging element 330 could move with respect to each other.

As indicated in FIGS. 8 and 9, the hanging element 330 includes a first position-limiting portion 331, a second position-limiting portion 132 and a fixing portion 133. The first position-limiting portion 331 includes a fixing board 3311, a first sliding portion 1312, a first baffle 1313, a carrier board 3314 and at least one slider 3315, wherein the first sliding portion 1312, the slider 3315 and the first baffle 1313 are disposed (for example, fixed) on the carrier board 3314.

As indicated in FIGS. 8 and 9, the carrier board 3314 and the fixing board 3311 could slide with respect to each other. For example, the carrier board 3314 has a first chute 331r1 and at least one second chute 331r2. The first sliding portion 1312 passes through the first chute 331r1. The first sliding portion 1312 and the first chute 331r1 could slide with respect to each other. The slider 3315 passes through the second chute 331r2. The slider 3315 and the second chute 331r2 could slide with respect to each other.

As indicated in FIGS. 8 to 9, the fixing board 3311 could be fixed to the top end 321 of the support 320. Thus, the top end 321 of the support 320 and the fixing board 3311 could be synchronized. After the fixing portion 133 fixes relative positions between the first sliding portion 1312 (or the carrier board 3314) and the second position-limiting portion 132 (when the fixing portion 133 is fastened, the carrier board 3314 and the second position-limiting portion 132 fix each other, and the fixing board 3311 could slide on the interval between the carrier board 3314 and the second position-limiting portion 132), the fixing board 3311 could be driven by the top end 321 to slide with respect to the carrier board 3314, so that the distance H3 (illustrated in FIG. 10) between the screen body 111 and the second position-limiting portion 132 (or the plate 10) could be adjusted. Besides, an elastic piece (not illustrated) could be disposed between the slider 3315 and the second chute 331r2 for adjusting the inclination of the fixing board 3311, so that when the distance H3 increases, the position by which the fixing board 3311 is coupled to the top end 321 will slightly tilt downwards.

As indicated in FIGS. 8 and 10, the bottom end 322 of the support 320 and the fixing element 340 could be rotatably connected by rotating around the pivoting axis direction A4, which is parallel to the extension direction of the surface 10s. Thus, the support 320 and the fixing element 340 could rotate with respect to each other around the pivoting axis direction A4. In embodiment, the pivoting axis direction A4 is parallel to the first shaft A1.

Figure 11:
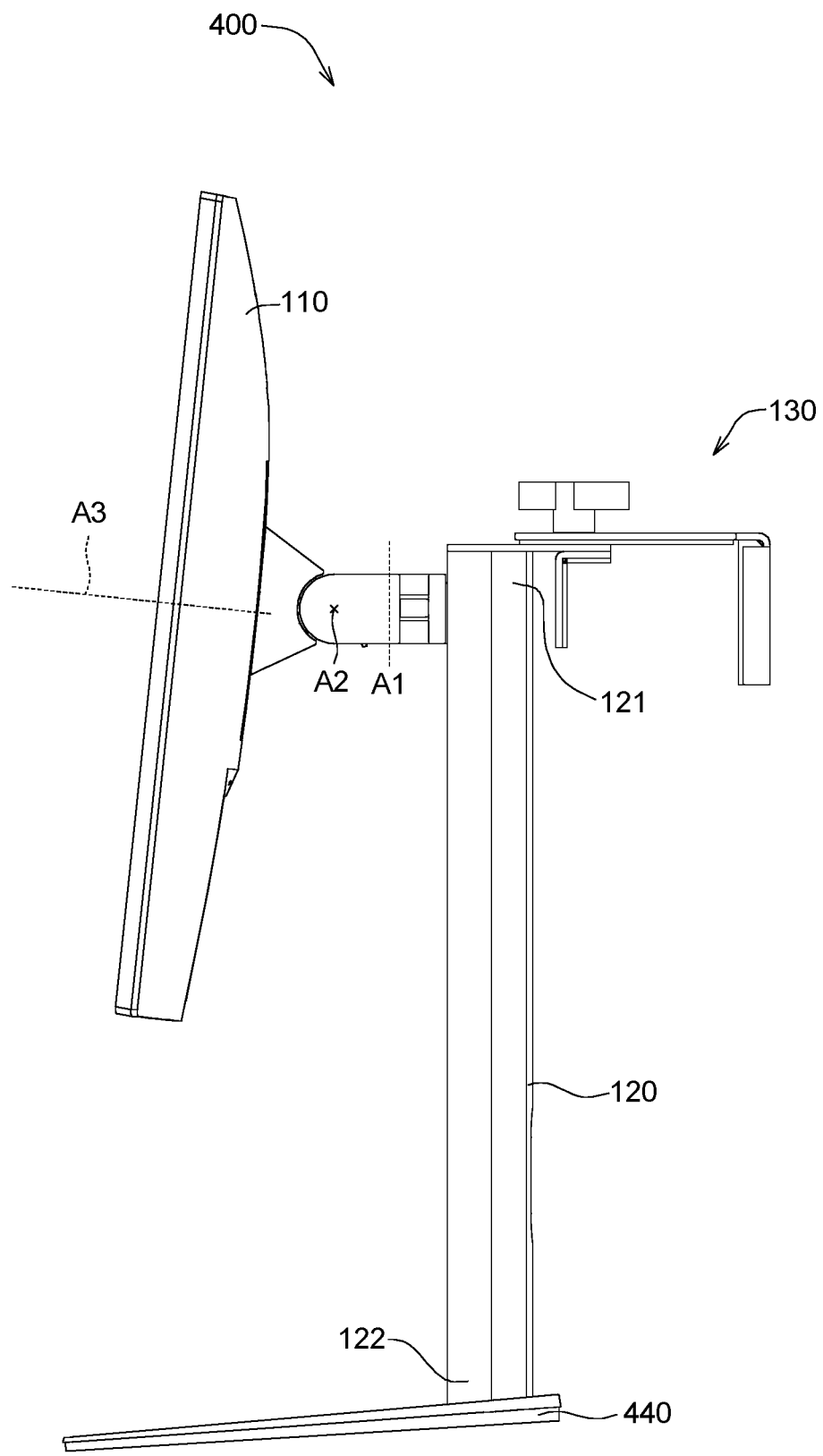
FIG. 11 is a schematic diagram of a display according to another embodiment of the present invention.

Referring to FIG. 11, a schematic diagram of a display 400 according to another embodiment of the present invention is shown. The display 400 includes a screen 110, a support 120, a hanging element 130 and a base 440. Technical features of the display 400 of the present invention are similar or identical to that of the display 100 except that the display 400 further includes a base 440, which could be placed on a carrier, such as a ground or a desktop.

The base 440 is detachably connected to the bottom end 122 of the support 120. When the base 440 connects the bottom end 122, the display 400 supports the screen 110 through the base 440. When the base 440 is detached, the screen 110 is hung on an upper edge 11 of the plate 10 (the plate 10 is illustrated in FIG. 2) through the hanging element 130. Besides, the base 440 and the bottom end 122 of the support 120 could be screwed together. For example, a screw element (not illustrated) could be screwed to the bottom end 122 of the support 120 from the bottom surface of the base 440 to fix relative positions between the base 440 and the support 120. However, the bonding method between the base 440 and the support 120 is not restricted in the embodiment of the present invention, and the base 440 and the support 120 could be bonded using other engaging technology.

In the present embodiment, although it is not illustrated in FIG. 11, the display 400 further includes a fixing element 140, which could be detachably disposed at the bottom end 122 of the support 120. When the base 440 is detached, the fixing element 140 connects the bottom end 122 and is fixed on a surface 10s of the plate 10 as indicated in FIG. 2.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display, comprising:
 a screen;
 a support connected to the screen and comprising a second engaging portion, a top end and a bottom end having a bottom surface, wherein the second engaging portion extends toward the top end from the bottom surface;
 a hanging element disposed on the top end; and a fixing element comprising a first engaging portion and disposed at the bottom end by the first engaging portion inserting into the second engaging portion;

wherein when the hanging element is hung on an edge of a plate, the fixing element is fixed on a surface of the plate;

wherein the surface of the plate is parallel to a long axis of the support;

wherein the hanging element comprises a first position-limiting portion and a second position-limiting portion, the first position-limiting portion is fixed to the top end, and the second position-limiting portion and the first position-limiting portion are movable with respect to each other; the first position-limiting portion comprises a first sliding portion, the second position-limiting portion comprises a second sliding portion, and the first sliding portion and the second sliding portion are slidable with respect to each other;

wherein the first position-limiting portion comprises a fixing board and a carrier board; the fixing board is fixed to the top end of the support, the fixing board is slidably disposed between the carrier board and the second positon-limiting portion.

2. The display according to claim 1, wherein the first sliding portion is a protruding column, the second sliding portion is a chute, and the protruding column passes through the chute; the protruding column and the support extend along an extension direction, the chute extends along an adjustment direction, and the adjustment direction and the extension direction are perpendicular to each other.

3. The display according to claim 1, wherein the hanging element further comprises a fixing portion, and the fixing portion selectively fixes or releases the first position-limiting portion and the second position-limiting portion.

4. The display according to claim 3, wherein the protruding column has a male screw, and the fixing portion further has a female screw; the male screw of the protruding column and the female screw of the fixing portion are screwed together.

5. The display according to claim 1, wherein the hanging element comprises a first baffle and a second baffle; the first baffle, the second baffle and the support extend along an extension direction, the first baffle and the second baffle are separated from each other along an adjustment direction, and the adjustment direction and the extension direction are perpendicular to each other.

6. The display according to claim 1, wherein the first position-limiting portion comprises a first baffle, and the second position-limiting portion comprises a second baffle; the first baffle, the second baffle and the support extend along an extension direction, the first baffle and the second baffle are separated from each other along an adjustment direction, and the adjustment direction and the extension direction are perpendicular to each other.

7. The display according to claim 1, wherein the fixing element comprises a magnetic element, and the magnetic element of the fixing element and the surface of the plate are bonded by a magnetic attraction force.

8. The display according to claim 1, wherein the fixing element comprises a hook, the plate has a hole extending from the surface in a direction away from the display, and the hook and the hole are hooked together.

9. The display according to claim 1, wherein the first position-limiting portion has a terminal surface and a recess; the recess extends towards the bottom end from the terminal surface.

10. The display according to claim 1, wherein the bottom end of the support is pivotally connected to the top end of the fixing element, the support and the second position-limiting portion of the hanging element are movable with respect to each other.

11. The display according to claim 1, wherein the bottom end of the support and the fixing element are connected with each other and rotatable around a pivoting axis direction parallel to the surface.

12. The display according to claim 1, further comprising:
a base detachably connected to the bottom end, wherein when the base connects the bottom end, and the base supports the screen; when the base is detached from the support, the screen is hung on an upper edge of the plate through the hanging element.

13. A display, comprising:
a screen;
a support connected to the screen and comprising a second engaging portion, a top end and a bottom end having a bottom surface, wherein the second engaging portion extends toward the top end from the bottom surface;
a hanging element disposed on the top end; and
a base detachably connected to the bottom end; and
a fixing element comprising a first engaging portion and detachably disposed at the bottom end by the first engaging portion inserting into the second engaging portion;
wherein when the base connects the bottom end, and the base supports the screen; when the base is detached from the support, the screen is hung on an edge of a plate through the hanging element;
wherein when the base is detached, the fixing element connects the bottom end and is fixed on a surface of the plate;
wherein the surface of the plate is parallel to a long axis of the support;
wherein the hanging element comprises a first position-limiting portion and a second position-limiting portion, the first position-limiting portion is fixed to the top end, and the second position-limiting portion and the first position-limiting portion are movable with respect to each other; the first position-limiting portion comprises a first sliding portion, the second position-limiting portion comprises a second sliding portion, and the first sliding portion and the second sliding portion are slidable with respect to each other;
wherein the first position-limiting portion comprises a fixing board and a carrier board; the fixing board is fixed to the top end of the support, the fixing board is slidably disposed between the carrier board and the second position-limiting portion.

14. The display according to claim 13, wherein the bottom end of the support is pivotally connected to the fixing element, the top end of the support and the hanging element are movable with respect to each other for adjusting a distance between the screen and the plate.

15. The display according to claim 13, wherein the bottom end of the support and the fixing element are connected with each other and rotatable around a pivoting axis direction parallel to the surface.

16. The display according to claim 13, wherein the hanging element comprises a first baffle and a second baffle; the first baffle, the second baffle and the support extend along an extension direction, and the first baffle and the second baffle are separated from each other along an adjustment direction, and the adjustment direction and the extension direction are substantially perpendicular to each other.

\* \* \* \* \*